(12) United States Patent
Huang (10) Patent No.: US 7,232,749 B2
(45) Date of Patent: Jun. 19, 2007

(54) INTEGRATED CIRCUIT INDUCTANE AND THE FABRICATION METHOD THEREOF

(75) Inventor: Min-Lung Huang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 335 days.

(21) Appl. No.: 11/035,199

(22) Filed: Jan. 14, 2005

(65) Prior Publication Data

US 2005/0181570 A1 Aug. 18, 2005

(30) Foreign Application Priority Data

Jan. 16, 2004 (TW) .............................. 93101273 A (51) Int. Cl.
*H01L 21/4763* (2006.01)

(52) U.S. Cl. ...................... 438/618; 438/622; 438/623; 438/624; 438/625; 438/626; 257/E21.575

(58) Field of Classification Search ................ 438/618, 438/622, 623, 624, 625.626
See application file for complete search history.

(56) References Cited

U.S. PATENT DOCUMENTS 6,287,931 B1 * 9/2001 Chen ........................... 438/381
2003/0148558 A1 * 8/2003 Kubo et al. .................. 438/128

* cited by examiner

*Primary Examiner*—Asok K. Sarkar
*Assistant Examiner*—Victor V. Yevsikov (57) ABSTRACT

An integrated circuit inductance and the fabrication method thereof are disclosed. The manufacture process provided by the present invention fabricates an integrated circuit inductance having a simple production process, low cost, a near equal loop size and good performance, due to making the order of the planarization processes of the inductance loops substantially perpendicular to the wafer and the direction of the current of the inductance substantially in parallel with the wafer, by way of the manufacture process of the plugs and the conductive wires of the integrated-circuit process.

26 Claims, 14 Drawing Sheets

INTEGRATED CIRCUIT INDUCTANE AND THE FABRICATION METHOD THEREOF

RELATED APPLICATIONS

The present application is based on, and claims priority from, Taiwan, R.O.C. Application Serial Number 93101273, filed Jan. 16, 2004, the disclosure of which is hereby incorporated by reference herein in its entirety.

BACKGROUND OF THE INVENTION

1. Field of the Invention

The present invention relates to an inductance and a fabrication method thereof, and more particularly to an integrated circuit inductance and a fabrication method thereof.

2. Description of the Prior Art

It can be said that the invention of the integrated circuit has more influence on the development of the human culture than the invention of the steam engine and the industrial revolution did during the last forty years since the integrated circuit was invented in 1985. In 1946, the University of Pennsylvania had carried out a first vacuum-tube electronic digital computer called an electronic numerical integrator and calculator (ENIAC). The computer was the first calculating machine composed of electronic devices, 1800 vacuum tubes, could operate 5000 times addition operation per minute. Comparing the operation velocity of ENIAC with the recent central processing unit (CPU) whose velocity even can reach thousands GHz, the velocity difference between the two means is going so far as to $10^6$.

The astonishing advancement of the operational ability of the integrated circuit is contributed by the gradually micro-miniaturizing size of the circuit components (or elements) which are being micro-miniaturized even to millimicron order today. The manufacture process of the integrated circuit is basically a planarization process for forming a plurality of plane structures. The so-called plane structure is not actually a complete plane structure, and still has a part of three-dimension components thereon to connect other components in different planes. The most part of the circuit components, such as transistors, could still have good performances after being micro-miniaturized into the plane structures via the integrated circuit process, but some of the circuit components, especially the inductance that essentially must be a three-dimension structure, could not. As far as the manufacture process of the inductance is concerned, apparently, utilizing the photolithography process with a lot of masks to stack the loops of the inductance layer by layer upward is needed, and that makes the manufacture process become complicated and have a higher cost. Furthermore, the property of the inductance could be influenced since the size of each loop of the inductance could not be equal and the size of each loop must gradually be decreased or increased in turn.

Due to the disadvantages of the traditional integrated circuit inductance and the fabrication thereof mentioned above, there need to provide an improved integrated circuit inductance and the fabrication method thereof to overcome the above-mentioned problems.

SUMMARY OF THE INVENTION

It is one of objectives of the present invention to provide an integrated circuit inductance and the fabrication method thereof by applying the existing manufacturing technologies of the integrated circuit.

It is another one of objectives of the present invention to provide an integrated circuit inductance whose manufacture process is simple.

It is another one of objectives of the present invention to provide an integrated circuit inductance whose size is easily controlled.

The technique artifice of the present invention includes the following steps. First, a first dielectric layer and a first photo-resist layer thereon are provided. Following, a first pattern is formed in the first photo-resist layer through exposing a portion of the first dielectric layer, wherein the first pattern has a plurality of first conductive wires substantially in parallel with one another. After that, a first conductive material is filled into the first pattern to form the first conductive wires, and then the first photo-resist layer is removed. Subsequently, a second dielectric layer is formed on the first conductive wires and the first dielectric layer, and a second photo-resist layer is formed on the second dielectric layer. Then, a plug pattern is formed in the second photo-resist layer through exposing a portion of the second dielectric layer, the plug pattern has a plurality of plugs located at a plurality of terminals of the first conductive wires. Following, the second dielectric layer is etched with the plug pattern as a mask to expose the two terminals of each the first conductive wire. A second conductive material is filled into the plug pattern to form the plugs in parallel with one another and substantially perpendicular to the first conductive wires, and then the second photo-resist layer is removed. After that, a third photo-resist layer is formed on the second dielectric layer and the plugs. A second pattern is formed in the third photo-resist layer through exposing a portion of the second dielectric layer and the plugs, wherein the second pattern has a plurality of second conductive wires substantially in parallel with one another. The second pattern connects two plugs which are located at two respective terminals of two adjacent first conductive wires and in diagonal relation. Subsequently, a third conductive material is filled into the second pattern to form the second conductive wires in parallel with one another and substantially perpendicular to the plugs. From above, it can be found that the second conductive wires connect two adjacent first conductive wires through two plugs which are located at two respective terminals of the two adjacent first conductive wires and in diagonal relation. Then, the third photo-resist layer is removed. Finally, a third dielectric layer is formed on the second conductive wires and the second dielectric layer.

Comparing the effect of the method of the present invention with the one of the prior art, the manufacture process provided by the present invention can fabricate an integrated circuit inductance having a simple production process, low cost, a near equal loop size and good performance, due to making the order of the planarization processes of the inductance loops substantially perpendicular to the wafer and the direction of the current of the inductance substantially in parallel with the wafer, by way of the manufacture process of the plugs and the conductive wires of the integrated-circuit process.

The above mentioned contents of the present invention and the following description of the preferred embodiments are only for example, not intended to limit the scope of the invention. Thus, many equal variations and modifications of the embodiments could be made without departing form the spirit of the present invention should be covered by the following claims.

BRIEF DESCRIPTION OF THE DRAWINGS

The objectives, features of the present invention as well as the advantages thereof can be best understood through the following preferred embodiments and the accompanying drawings, wherein.

DESCRIPTION OF THE PREFERRED EMBODIMENT

It is necessary to notice that the manufacture processes and the structures described below do not include the complete ones. The present invention can be implemented by any kind of manufacturing technologies, and only the necessary manufacturing technologies promoting to understand are described in the following. The invention will be explained in detail in accordance with the accompanying drawings. It is necessary to illustrate that the drawings in the below are only in simplified forms and not drawn in proportion to the real cases. Further, the dimensions of the drawings are enlarged for explaining and understanding more clearly.

Figure 1A:
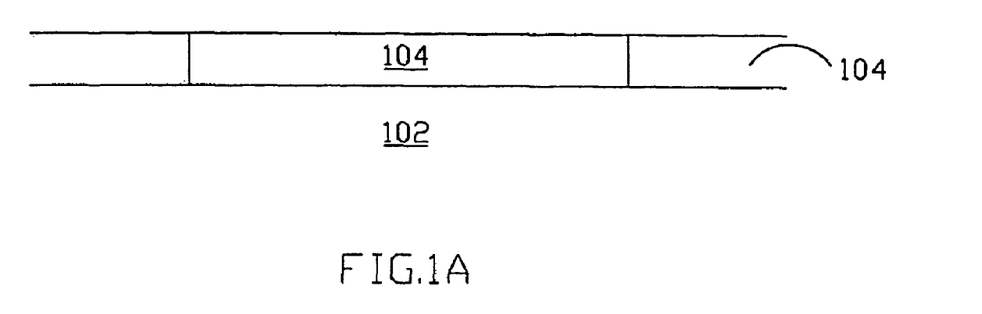
FIG. 1A shows the first pattern of the present invention.
Figure 1B:
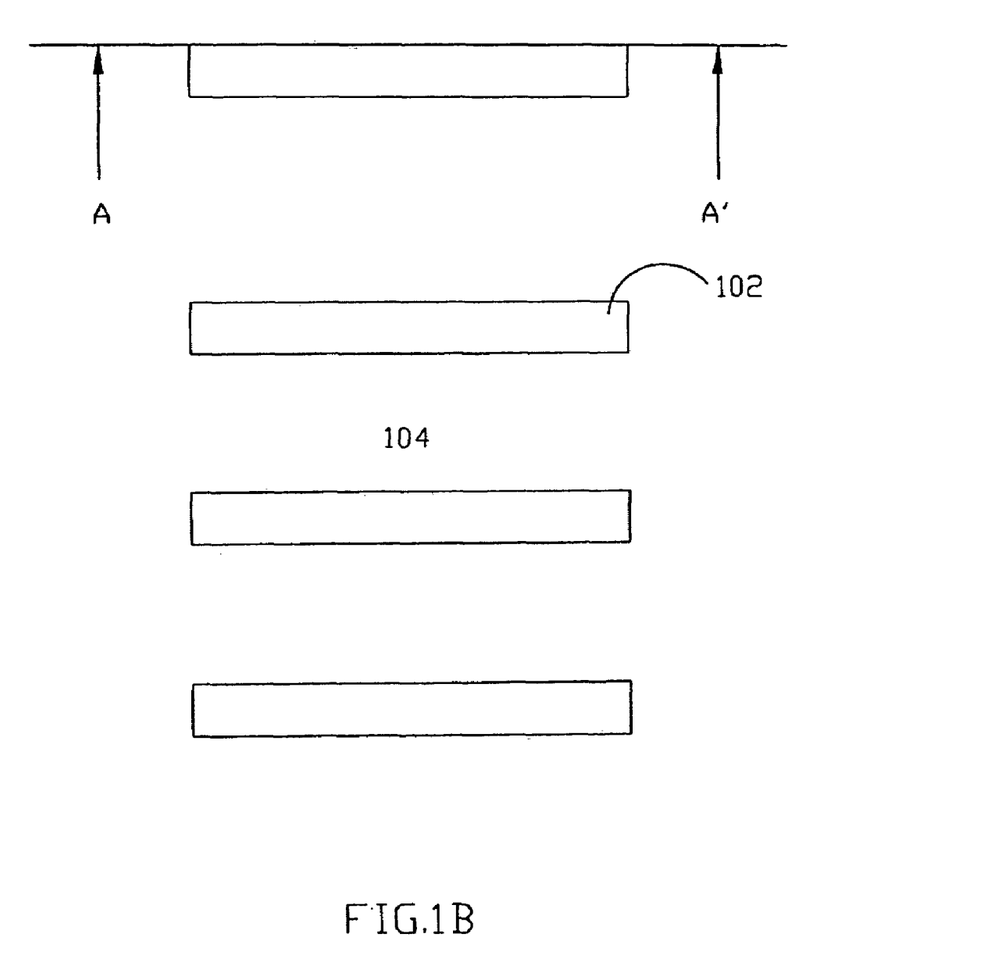
FIG. 1B shows the top view of the first pattern of the present invention.

In one embodiment of the present invention, an integrated circuit inductance is formed with the integrated-circuit process. Referring to FIG. 1A, a dielectric layer 102 and a photo-resist layer 104 thereon are provided, and a first pattern is formed in the photo-resist layer 104 by a photo-lithography process. The substrate under the dielectric layer 102 can be a wafer, or a multi-layer interconnect structure of the integrated circuit, or a multi-layer interconnect structure itself including the dielectric layer 102. FIG. 1B shows a top view of the first pattern, wherein the view of the cross-section AA' is just FIG. 1A. Before forming the photo-resist layer 104 on the dielectric layer 102, the dielectric layer 102 should be planarized with a planarization process to acquire a plane surface. The planarization process can be the chemical mechanical polishing method. Referring to FIG. 1B, it can be found that the first pattern has a plurality of first conductive wires substantially in parallel with one another, but the parallel condition is not a necessary condition.

Figure 1C:
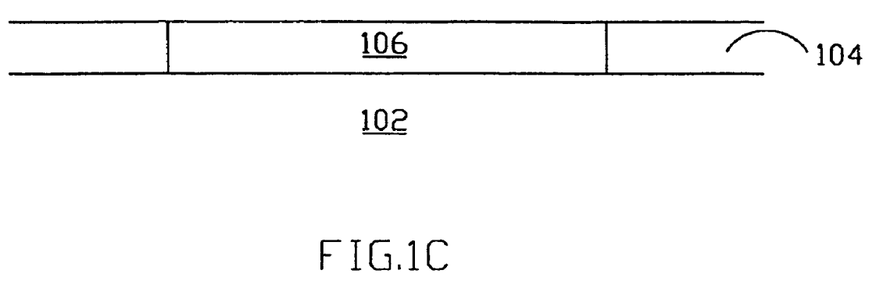
FIG. 1C shows a conductive materials filled into the first pattern of FIG. 1B to form the first conductive wires of the present invention.
Figure 1D:
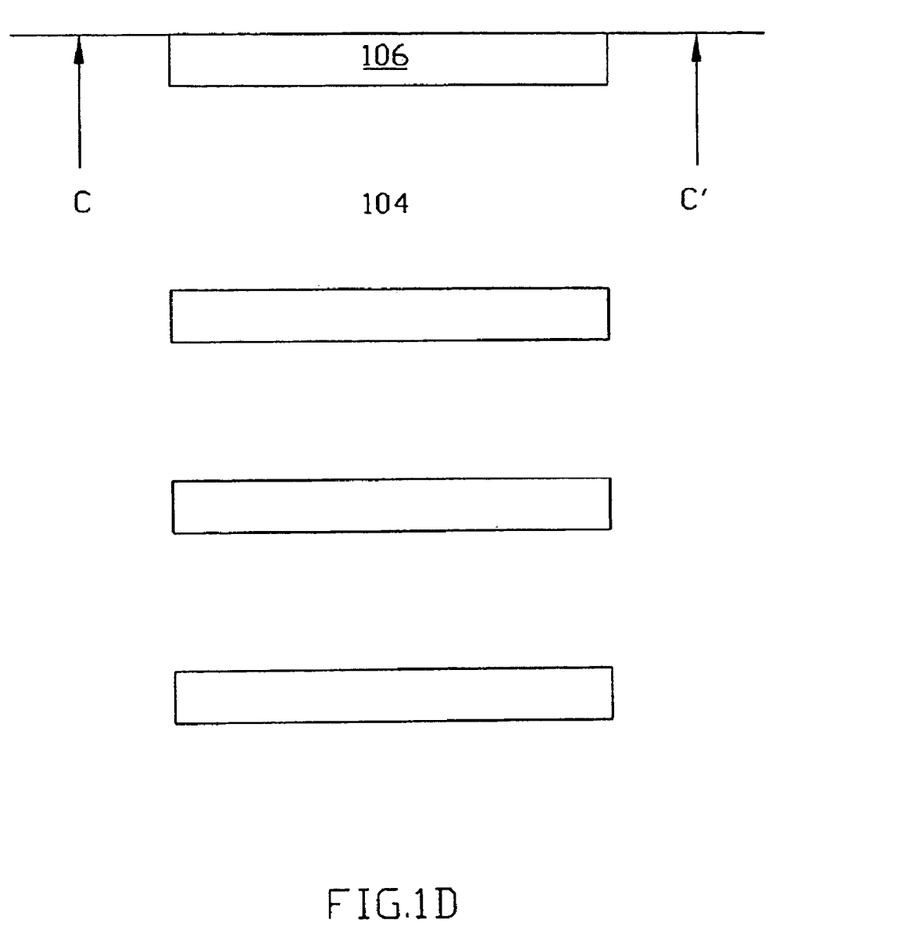
FIG. 1D shows the top view of the first conductive wires of the present invention.

Referring to FIG. 1C, it shows a conductive material is filled into the first pattern of FIG. 1B to form the first conductive wires 106. FIG. 1D is the top view of the first conductive wires 106, wherein the view of the cross-section CC' is just the FIG. 1C. The first conductive wires 106 can be formed by various deposited methods, such as physical and chemical deposition methods, which include evaporation, sputtering, chemical vapor deposition and electroless plating methods, etc. However, before the first conductive material being deposited to form the first conductive wires 106 by the electroless plating method, a metal layer or a conductive layer must be formed as an electrode or a seed layer. Subsequently, the planarization process could be applied to acquire a plane surface after the first conductive wires 106 are formed. The material of the first conductive wires 106 can be aluminum or copper, etc, but other conductive materials could not be excluded.

Figure 1E:
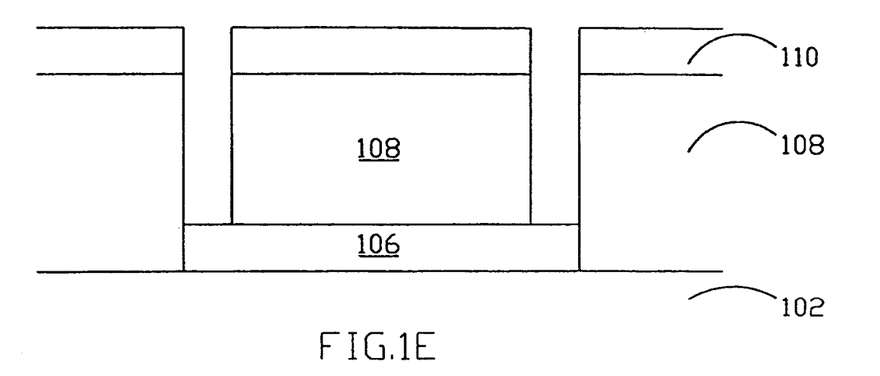
FIG. 1E shows a plug pattern of the present invention.
Figure 1F:
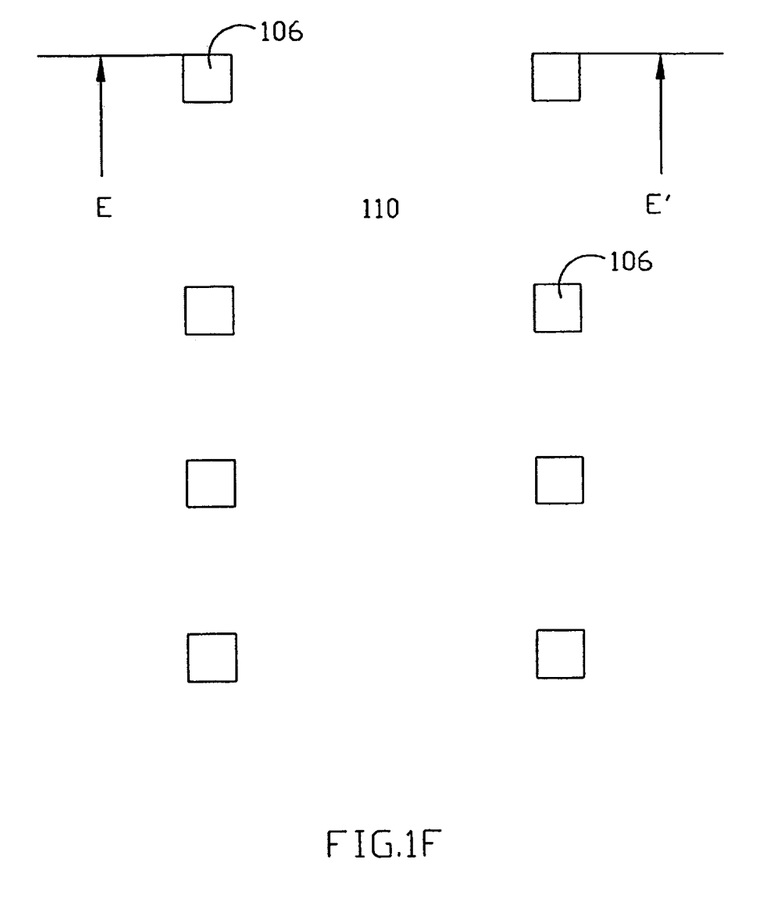
FIG. 1F shows the top view of the plug pattern of the present invention.
Figure 1G:
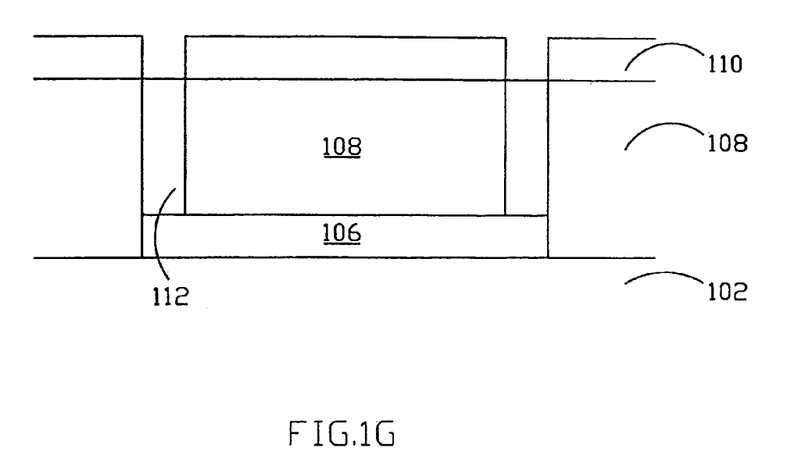
FIG. 1G shows the plugs of the present invention.

Referring to FIG. 1E, it shows a photo-resist layer 104 is removed and a dielectric layer 108 is formed on the first conductive wires 106 and the first dielectric layer 102, then, a photo-resist layer 110 is formed on the dielectric layer 108. A plug pattern is formed in the photo-resist layer 110 for exposing the dielectric layer 108 by the photolithography process. Following, the dielectric layer 108 is etched with the plug pattern as a mask to expose a portion of the first conductive wires 106. FIG. 1F is a top view of the plug pattern, wherein the view of the cross-section EE' is just FIG. 1E, and the portion of the first conductive wires exposed by etching is shown in FIG. 1F. The method applied to etch the dielectric layer 108 can be selected from wetting etching, drying etching, isotropic etching and anisotropic etching methods, etc. Subsequently, referring to FIG. 1G, it shows plugs 112 are formed by filling a conductive material into the plug pattern as shown in FIG. 1E. The plugs 112 can be formed by various deposited methods, such as a physical deposition and chemical deposition, which include evaporation, sputtering, chemical vapor deposition and electroless plating methods, etc. However, before the conductive material being deposited to form the plugs 112 by the electroless plating method, a metal layer or a conductive layer must be formed as an electrode- or a seed layer. The material of the plugs 112 can be aluminum or copper, etc, but other conductive materials can not be excluded.

Figure 1H:
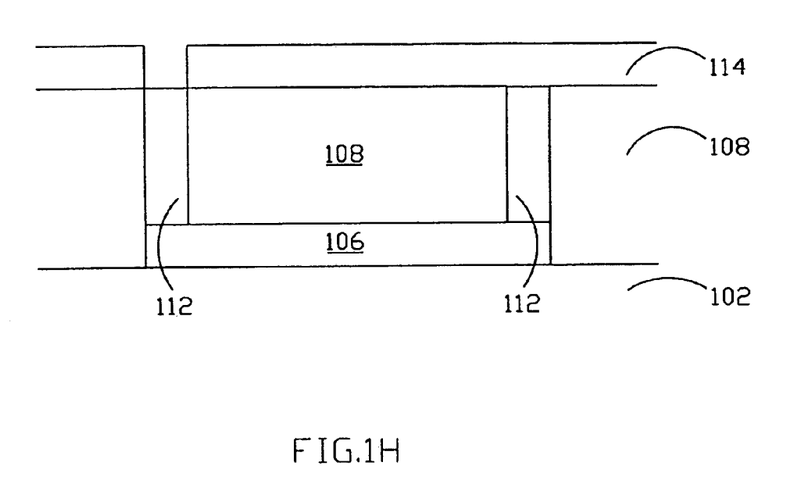
FIG. 1H shows the cross-section view of the second pattern.
Figure 1I:
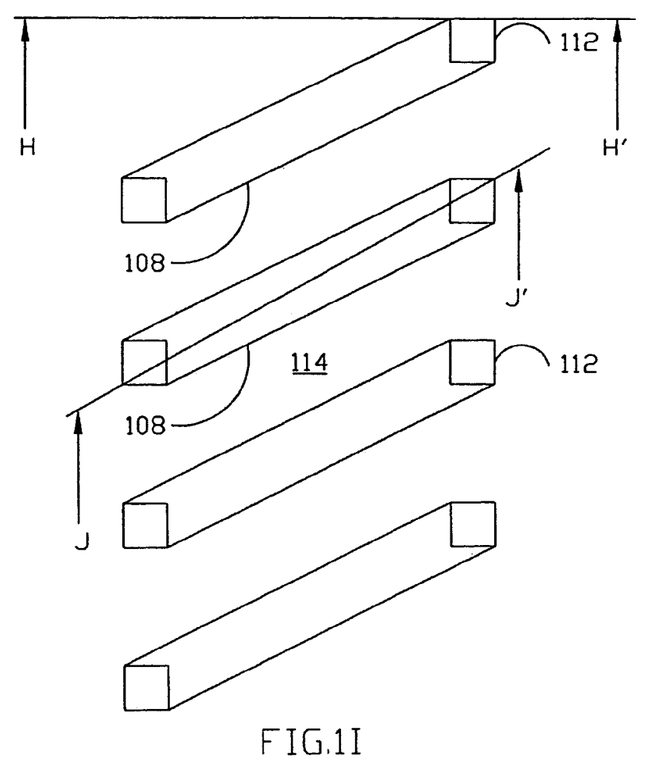
FIG. 1I shows the top view of the second pattern.
Figure 1J:
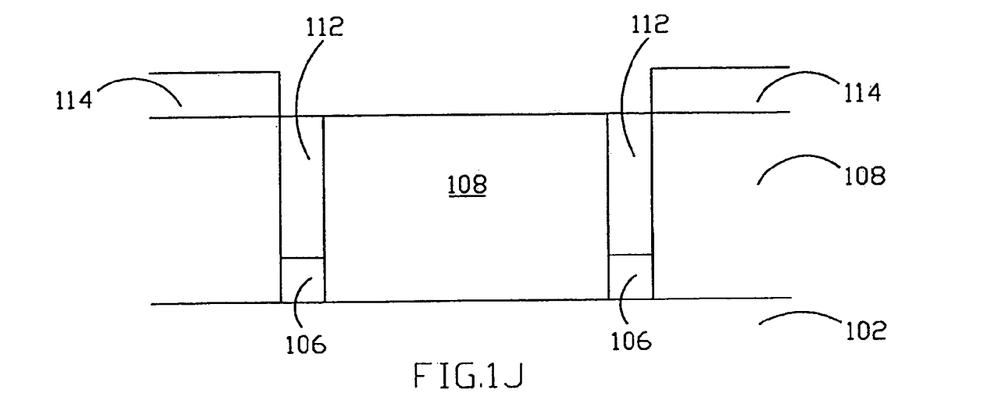
FIG. 1J shows the view of the cross-section JJ' of FIG. 1I.

Referring to FIG. 1H, it shows a photo-resist layer 114 is formed on the dielectric layer 108 after the photo-resist layer 110 is removed. A second pattern is formed in the photo-resist layer 110 by the photolithography process for exposing a portion of the dielectric layer 108 and the plugs 112. FIG. 1I is a top view of the second pattern, wherein the view of the cross-section HH' is just FIG. 1H, and the view of the cross-section JJ' is just FIG. 1J. Before the photo-resist layer 114 being formed on the dielectric layer 108, the dielectric layer 108 could be planarized with a planarization process to acquire a plane surface. The planarization process can be the chemical mechanical polishing method. Referring to FIG. 1I, it can be found that the second pattern has a plurality of second conductive wires substantially in parallel with one another, additionally, by the plugs 112, the second conductive wires connect the first conductive wires by an angle; every second conductive wire and first conductive wire connects the plugs 112 by an another angle which is not necessary a right angle. Also, the parallel condition of the second conductive wires is not a necessary condition.

Figure 1K:
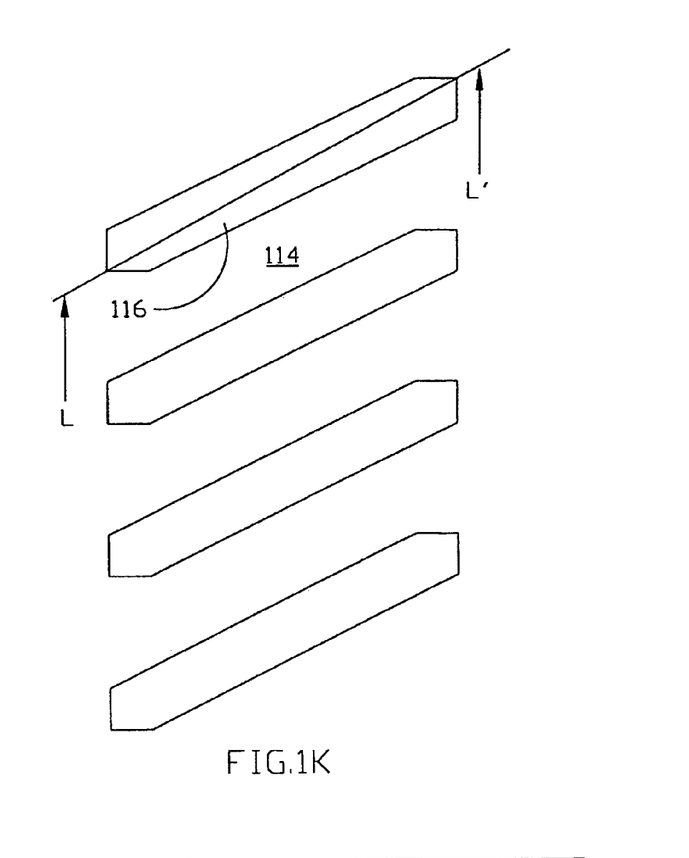
FIG. 1K shows the top view of the second conductive wires.
Figure 1L:
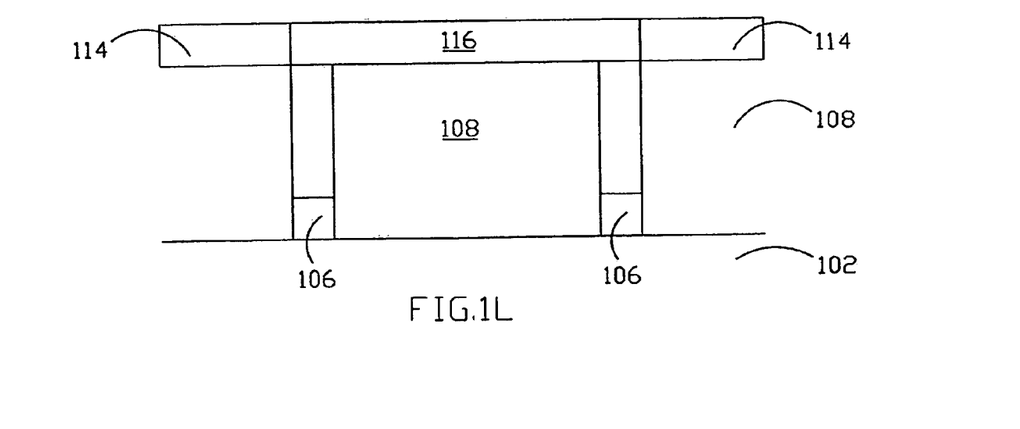
FIG. 1L shows the view of the cross-section LL' of FIG. 1K.

Referring to FIG. 1K, it shows a conductive material is filled into the second pattern of FIG. 1I to form the second conductive wires 116. The second conductive wires 116 can be formed by various deposition methods, such as physical deposition and chemical deposition, which include evaporation, sputtering, chemical vapor deposition and electroless plating methods, etc. However, before the second conductive material being deposited to form the second conductive wires 116 by the electroless plating method, a metal layer or a conductive layer must be formed as an electrode or a seed layer. Subsequently, a planarization process could be applied to acquire a plane surface after the second conductive wires 116 are formed. The material of the second conductive wires 116 could be aluminum or copper, etc, but other conductive materials could not be excluded. FIG. 1L shows a view of the cross-section LL' of FIG. 1K, wherein the two parts of the first conductive wires 106 with the plugs 112 are respectively located in the diagonal relation.

Figure 1M:
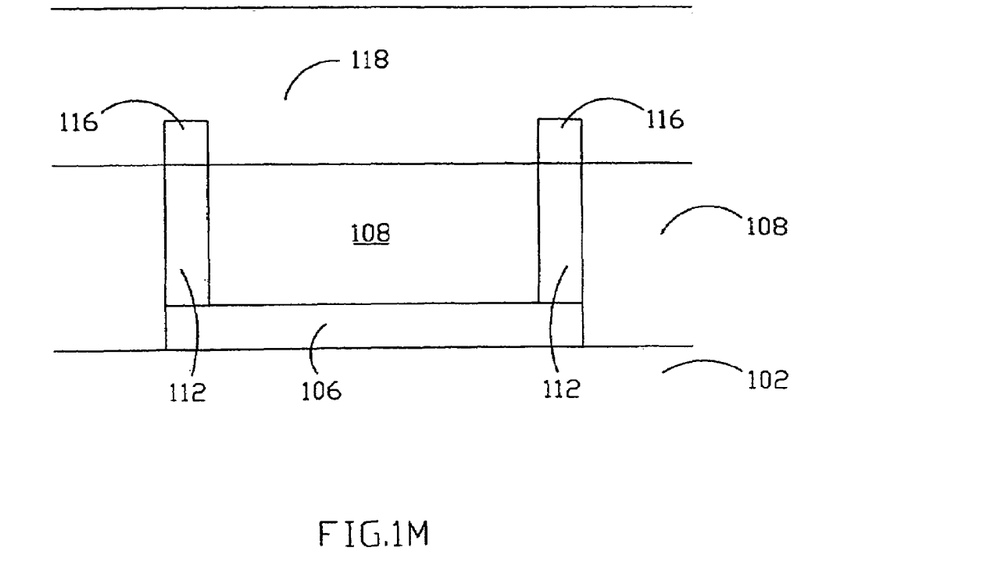
FIG. 1M shows the cross-section view in parallel with the cross-section HH' of the integrated circuit inductance of the present invention.

As FIG. 1M shown, after the photo-resist layer 114 is removed, a dielectric layer 118 is formed on the dielectric layer 108 and the second conductive wires 116. FIG. 1M shows a cross-section view in parallel with the cross-section HH', wherein each part of the second conductive wires 116 of FIG. 1M respectively belong to individual conductive wires in parallel with one another. A planarization process could be applied to acquire a plane surface after the dielectric layer 118 is formed, and the planarization process includes a chemical mechanical polishing method.

Figure 1N:
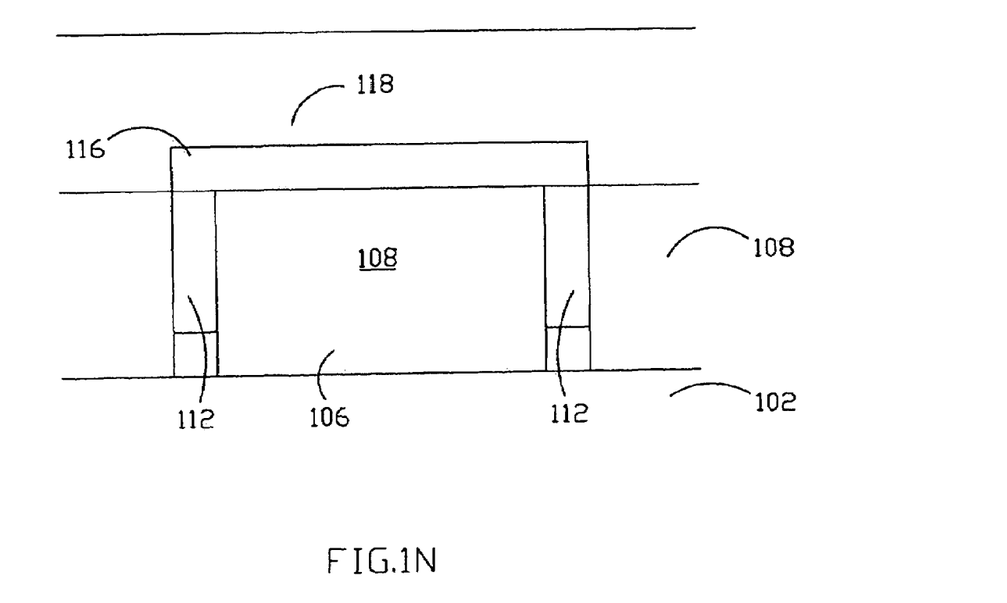
FIG. 1N shows the cross-section view in parallel with the cross-section LL' of the integrated circuit inductance of the present invention.

FIG. 1N shows a cross-section view in parallel with the cross-section LL', wherein each part of the first conductive wires 106 respectively belongs to individual conductive wires which are in parallel with one another. The plugs 106 in FIG. 1N are respectively located at the terminals of each of the first conductive wire.

Figure 2:
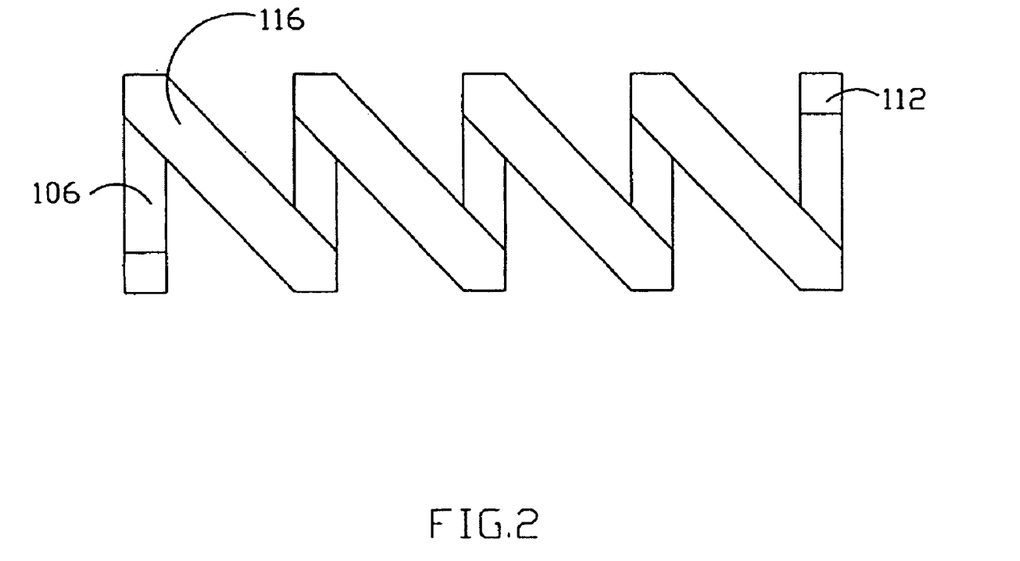
FIG. 2 shows the top view of the integrated circuit inductance of the present invention.
Figure 3:
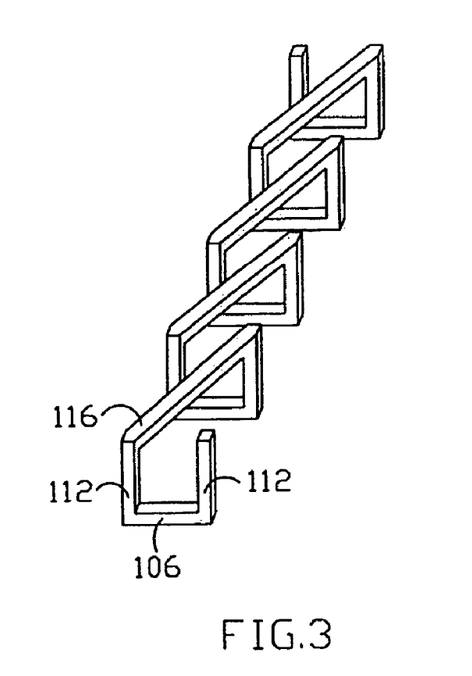
FIG. 3 shows the oblique view of the of the integrated circuit inductance of the present invention.

FIG. 2 and FIG. 3 respectively show a top and oblique view of the integrated circuit inductance of the present invention.

Figure 4A:
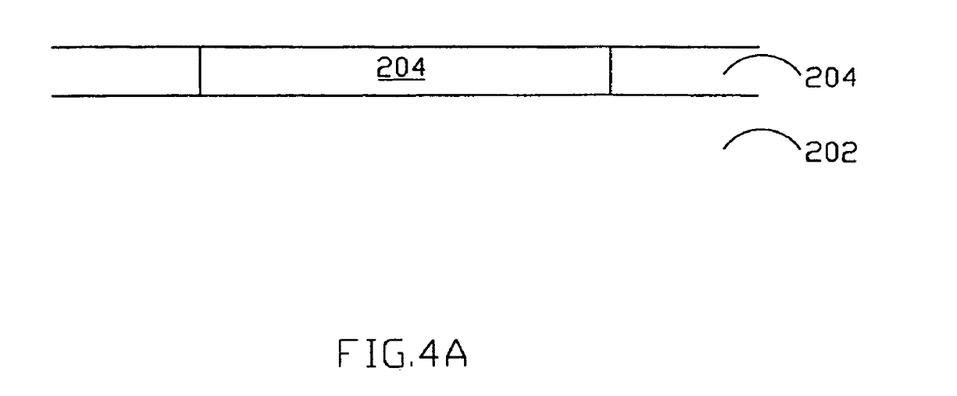
FIG. 4A shows the first pattern of another embodiment of the present invention.
Figure 4B:
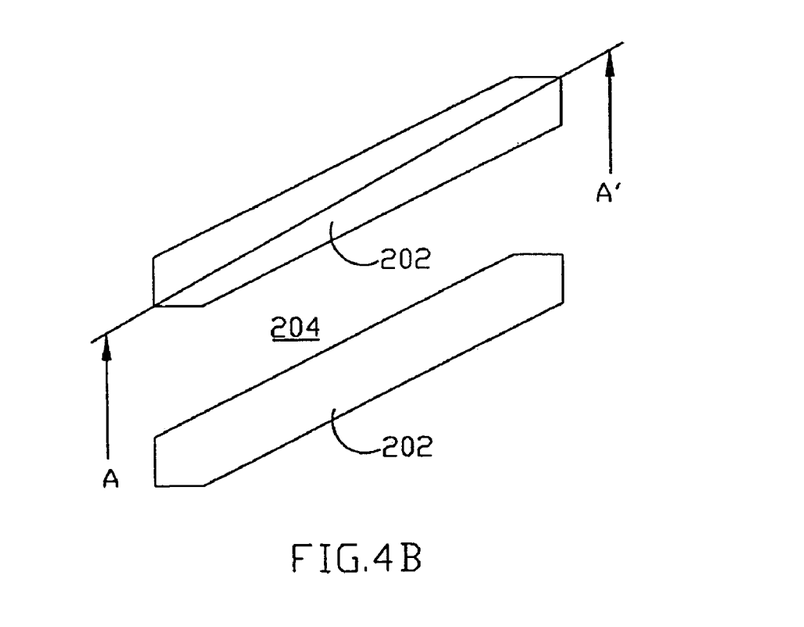
FIG. 4B shows the top view of the first pattern of the present invention.

Except for the process of the above-mentioned embodiments, other similar process also could be provided to form an integrated circuit inductance shown as FIG. 3. Referring to FIG. 4A, a dielectric layer 202 and a photo-resist layer 204 thereon are provided, and a first pattern is formed in the photo-resist layer 204 by a photolithography process. The substrate under the dielectric layer 202 can be a wafer, or a multi-layer interconnect structure of integrated circuit, or a multi-layer interconnect structure itself comprising the dielectric layer 102. FIG. 4B is the top view of the first pattern, wherein the view of the cross-section AA' is just the FIG. 4A. Before forming the photo-resist layer 204 on the dielectric layer 202, the dielectric layer 202 should be planarized with a planarization process to acquire a plane surface. The planarization process can be the chemical mechanical polishing method. From FIG. 4B, it can be found that the first pattern has a plurality of first conductive wires substantially in parallel with one another, but the parallel condition is not a necessary condition.

Figure 4C:
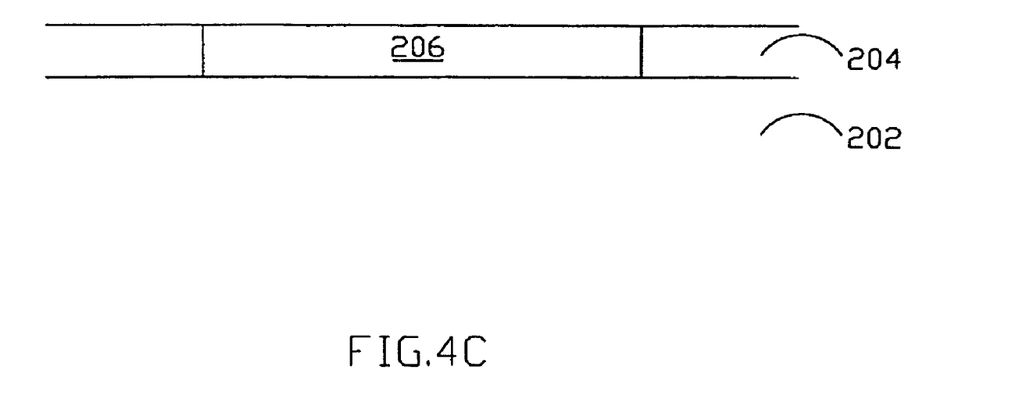
FIG. 4C shows a conductive material is filled into the first pattern of FIG. 4B to form the first conductive wires of the present invention.
Figure 4D:
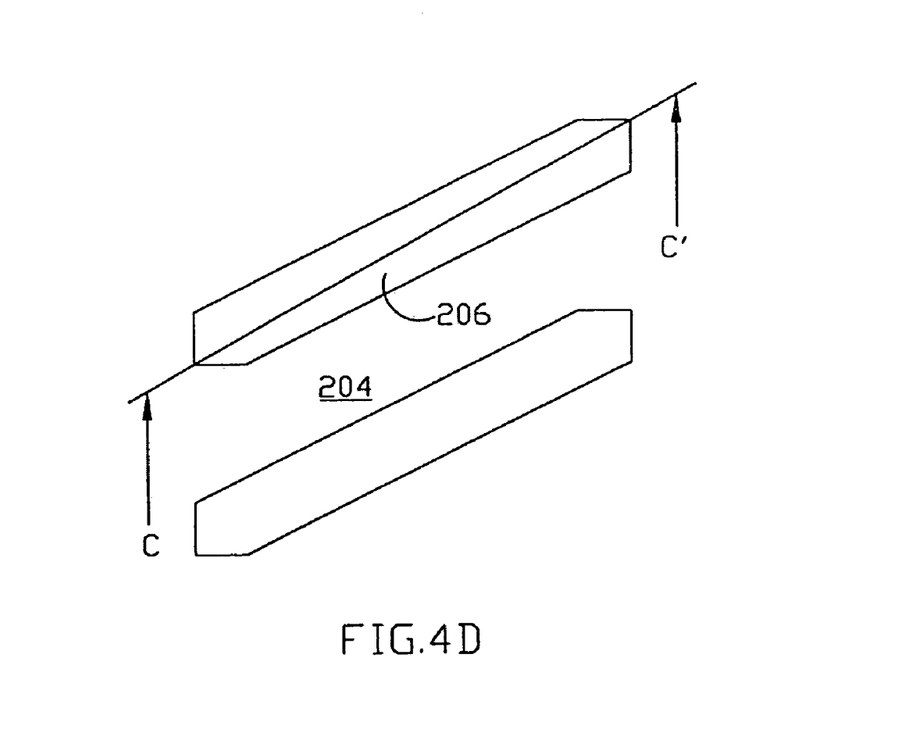
FIG. 4D shows the top view of the first conductive wires.

As FIG. 4C shown, a conductive material is filled into the first pattern of FIG. 4B to form first conductive wires 206. FIG. 4D is the top view of the first conductive wires 206, wherein the view of the cross-section CC' is just the FIG. 4C. The first conductive wires 206 can be formed by various deposition methods, such as physical and chemical deposition, which include evaporation, sputtering, chemical vapor deposition and electroless plating methods, etc. However, before the first conductive material is deposited to form the first conductive wires 206 by the electroless plating method, a metal layer or a conductive layer must be formed as an electrode or seed layer. Subsequently, the planarization process is applied to acquire a plane surface after the first conductive wires 206 are formed. The material of the first conductive wires 206 can be aluminum or copper, etc, but other conductive materials can not be excluded.

Figure 4E:
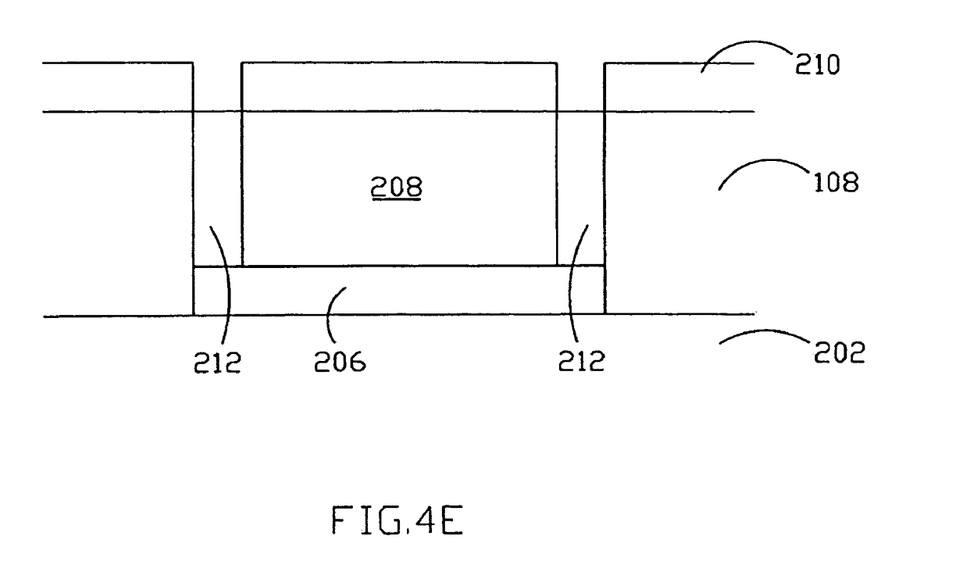
FIG. 4E shows a plug pattern of the present invention.
Figure 4F:
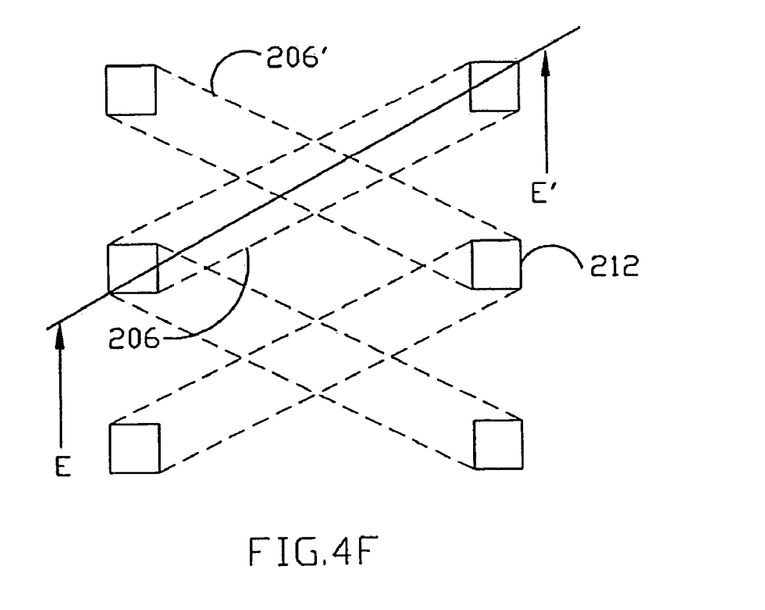
FIG. 4F shows the top view of the plug pattern.

Referring to FIG. 4E, it shows the photo-resist layer 204 is removed and a dielectric layer 208 is formed on the first conductive wires 206, then, a photo-resist layer 210 is formed on the dielectric layer 208. A plug pattern is formed in the photo-resist layer 210 to expose the dielectric layer 208 by the photolithography process. Following, the dielectric layer 208 is etched with the plug pattern as a mask to expose a portion of the first conductive wires 206. As FIG. 4F shown, each the first conductive wire defines a cross wire equal in length passing through the center of the first conductive wire. The plug pattern has a plurality of plugs located at a plurality of terminals of the first conductive wires 206 and the cross wires. The method applied to etch the dielectric layer 208 can be selected from wetting etching, drying etching, isotropic etching and anisotropic etching, etc. FIG. 4E and FIG. 4F both show the conductive material is filled into the plug pattern to form the plugs 212. The plugs 212 could be formed by various deposited methods, such as physical and chemical deposition, which comprise evaporation, sputtering, chemical vapor deposition and electroless plating methods, etc. However, before the first conductive material being deposited to form the plugs 212 by the electroless plating method, a metal layer or a conductive layer must be formed as an electrode or seed layer. The material of the plugs 212 can be aluminum or copper, etc, but other conductive materials can not be excluded.

Figure 4G:
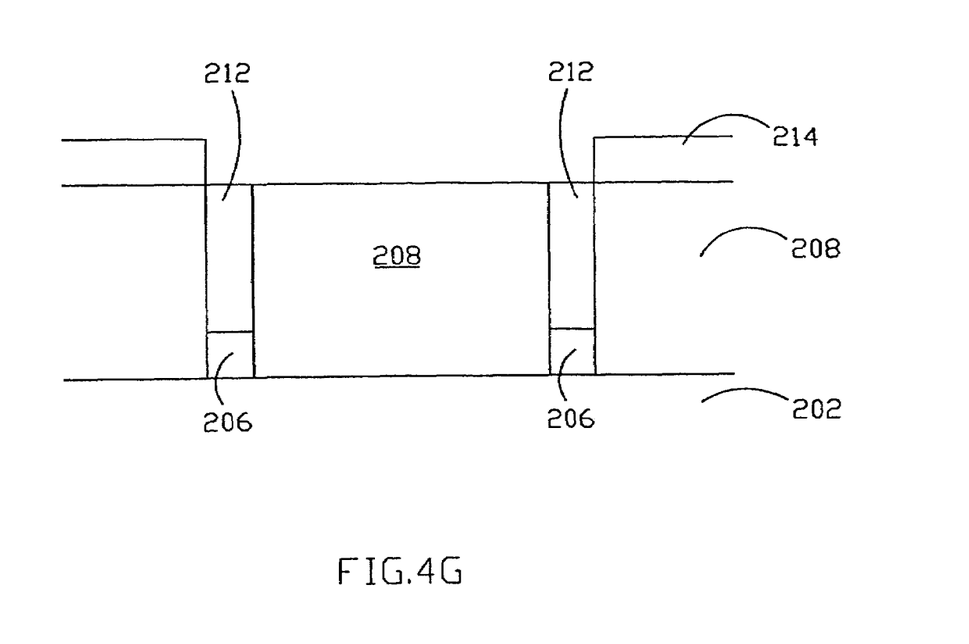
FIG. 4G shows the cross-section view of the second pattern of the present invention.
Figure 4H:
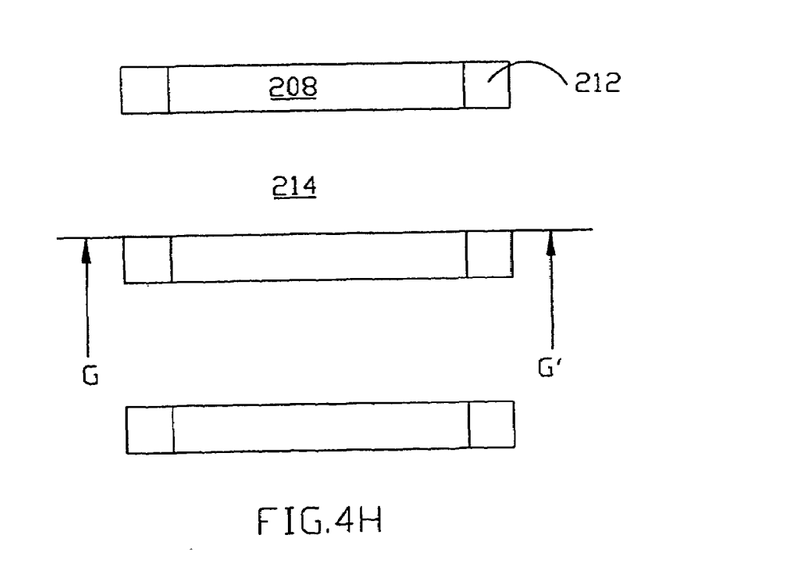
FIG. 4H shows the top view of the second pattern of the present invention.

Subsequently, as FIG. 4G shows a photo-resist layer 214 is formed on the dielectric layer 208 after the photo-resist layer 210 is removed. Applying the photolithography process, a plug pattern is formed in the photo-resist layer 210 to expose a portion of the dielectric layer 208 and a portion of the plugs 112. FIG. 4H is a top view of the second pattern, wherein the view of the cross-section GG' is just FIG. 4G. The second pattern has a plurality of wires substantially in parallel with one another, wherein the second pattern connects two plugs 212 which are respectively located at the terminals of each the cross wire. Before the photo-resist layer 214 is formed on the dielectric layer 208, the dielectric layer 208 and the plugs 212 should be planarized with a planarization process to acquire a plane surface. The planarization process can be the chemical mechanical polishing method. From FIG. 4H, it shows the second pattern has a plurality of wires substantially in parallel with one another, additionally, by the plugs 212, the second conductive wires connect the first conductive wires by an angle; every second conductive wire and first conductive wire connects the plugs 212 by an another angle which is not necessary a right angle. Also, the parallel condition of the second conductive wires is not a necessary condition.

Figure 4I:
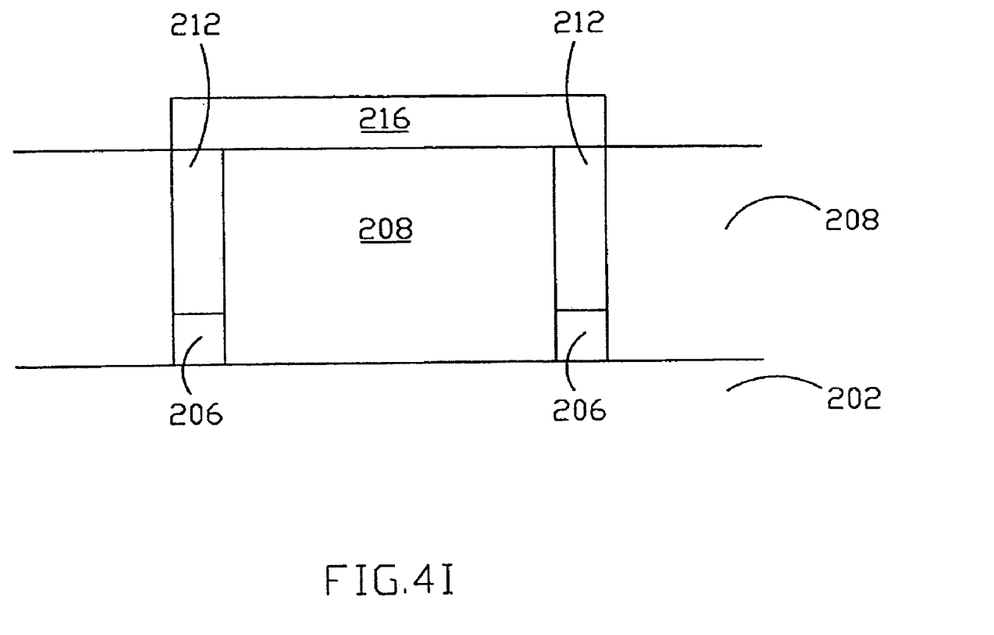
FIG. 4I shows the cross-section view of the second conductive wires of the present invention.
Figure 4J:
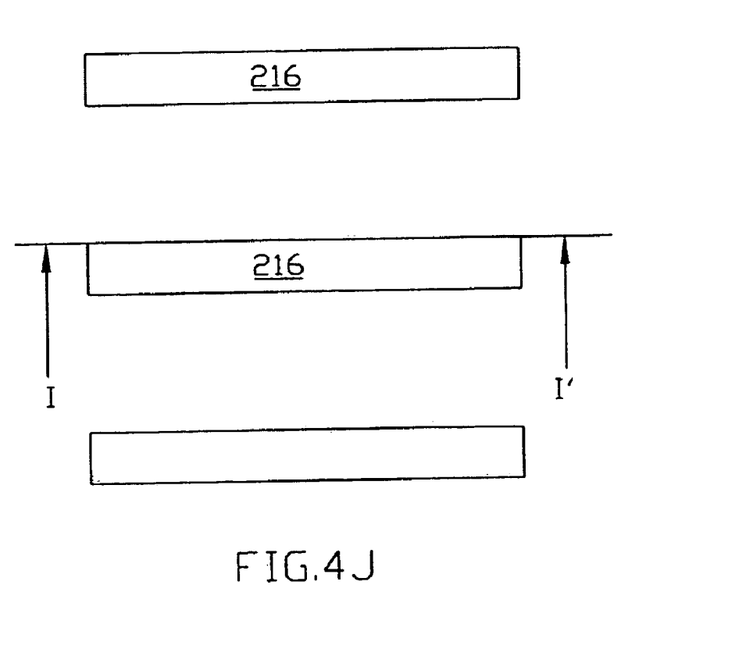
FIG. 4J shows the top view of the second conductive wires.

FIG. 4I shows a conductive material that is filled into the second pattern of FIG. 4G to form the second conductive wires 216, and then the photo-resist 214 is removed. The second conductive wires 216 can be formed by various deposition methods, such as physical deposition and chemical deposition, which comprise evaporation, sputtering, chemical vapor deposition and electroless plating methods, etc. However, before the second conductive material being deposited to form the second conductive wires 216 by the electroless plating method, a metal layer or a conductive layer must be formed as an electrode or a seed layer. Subsequently, a planarization process method could be applied to acquire a plane surface after the second conductive wires 216 are formed. The material of the second conductive wires 216 could be aluminum or copper, etc., but other conductive materials could not be excluded. FIG. 4J shows a top view cross-section of the second conductive wires 216, and the view of the cross-section II' is just FIG. 4I.

Figure 4K:
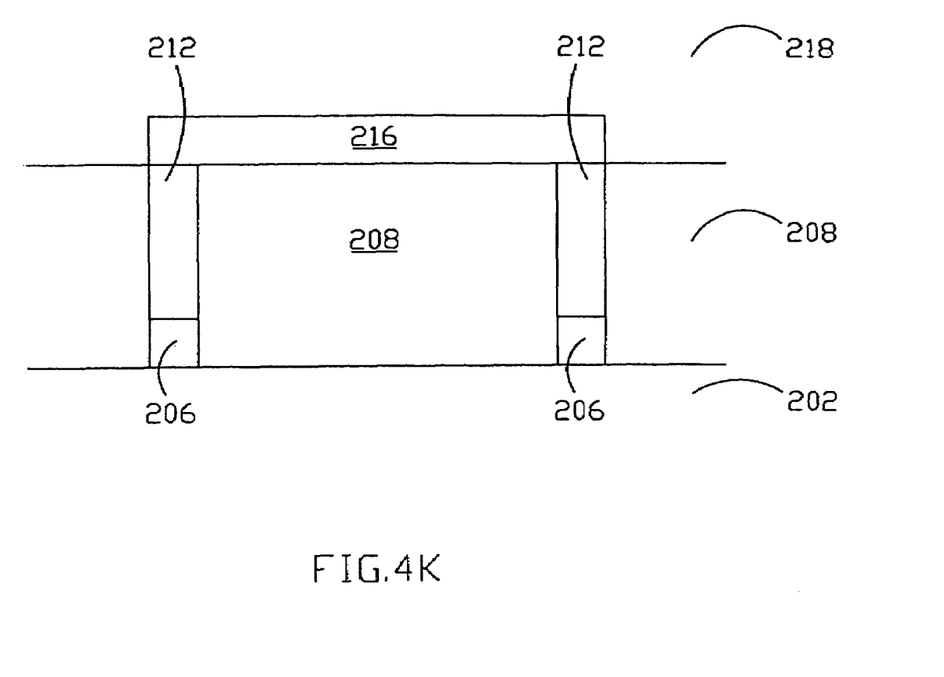
FIG. 4K shows the cross-section view of the integrated circuit inductance of the present invention.

FIG. 4K shows that a dielectric layer 218 is formed on the dielectric layer 208 and the second conductive wires 216. A planarization process method could be applied to acquire a plane surface after the dielectric layer 218 is formed, the planarization process method can be the chemical mechanical polishing method. The integrated circuit inductance formed in the above second embodiment is equal to the one of FIG. 3 rotated clockwise or counterclockwise by 180 degree.

The above-mentioned of the present invention, such as, the related embodiments, the component nouns of the embodiments, the angles between the components and the relative position of certain components, are only for example, not limits. For instance, "plug" is only the usual noun of the components installed through a dielectric layer. As a full inductance concerned, the plugs and the wires in the present invention are actually identical, they are all the portions of the inductance. Besides, the angles between the components are not necessary right angles, as shown in the drawings or the above mentions, as long as the inductance loops composed of the plugs and the conductive wires can induce the variation of the passing current to generate the electromotive force (emf) or voltage. Additionally, the amount of the loops composed of the plugs and the conductive wires can be increased according to the demand. Also, the terminals of the integrated circuit inductance can be connected with other components in the wafer to make up a demanded circuit, wherein the connecting method can be selected form photolithograph process, deposition process, etching process, and so on.

The above-mentioned preferred embodiments of the present invention are just for example, not limits. Thus, many equal variations and modifications of the embodiments made without departing form the spirit of the present invention should be covered by the following claims.

What is claimed is:

1. A method for manufacturing an integrated circuit inductance, comprising:
   providing a first dielectric layer and a first photo-resist layer thereon;
   forming a first pattern in said first photo-resist layer through exposing a portion of said first dielectric layer, said first pattern defining a plurality of first conductive wires substantially in parallel with one another;
   filling a first conductive material into said first pattern to form said first conductive wires;
   removing said first photo-resist layer;
   forming a second dielectric layer over said first conductive wires;
   forming a second photo-resist layer on said second dielectric layer;
   forming a plug pattern in said second photo-resist layer through exposing a portion of said second dielectric layer, wherein said plug pattern has a plurality of plugs located on a plurality of terminals of said first conductive wires;
   etching said second dielectric layer with said plug pattern as a mask to expose said two terminals of each said first conductive wire;
   filling a second conductive material into said plug pattern to form said plugs in parallel with one another and substantially perpendicular to said first conductive wires;
   removing said second photo-resist layer;
   forming a third photo-resist layer on said second dielectric layer and said plugs;
   forming a second pattern in said third photo-resist layer through exposing a portion of said second dielectric layer and said plugs, said second pattern defining a plurality of second conductive wires substantially in parallel with one another, wherein said second pattern connects two said plugs which are located at two said respective terminals of two said adjacent first conductive wires and in diagonal relation;
   filling a third conductive material into said second pattern to form said second conductive wires in parallel with one another and substantially perpendicular to said plugs;
   removing said third photo-resist layer; and
   forming a third dielectric layer over said second conductive wires and said second dielectric layer.

2. The method according to claim 1, wherein said first conductive material is selected from the group consisting of copper and aluminum.

3. The method according to claim 1, wherein said first conductive material is deposited by a method selected from the group consisting of physical deposition and chemical deposition.

4. The method according to claim 3, wherein said physical deposition is selected from the group consisting of evaporation and sputtering methods.

5. The method according to claim 3, wherein said chemical deposition is selected from the group consisting of chemical vapor deposition and electroless plating.

6. The method according to claim 1, wherein said second conductive material is selected from the group consisting of copper and aluminum.

7. The method according to claim 1, wherein said second conductive material is deposited by a method selected from the group consisting of a physical deposition and a chemical deposition.

8. The method according to claim 7, wherein said physical deposition is selected from the group consisting of evaporation and sputtering methods.

9. The method according to claim 7, wherein said chemical deposition is selected from the group consisting of chemical vapor deposition and electroless plating.

10. The method according to claim 1, wherein said third conductive material is selected from the group consisting of copper and aluminum.

11. The method according to claim 1, wherein said third conductive material is deposited by a method selected from the group consisting of physical deposition and chemical deposition.

12. The method according to claim 11, wherein said physical deposition is selected from the group consisting of evaporation and sputtering methods.

13. The method according to claim 11, wherein said chemical deposition is selected from the group consisting of chemical vapor deposition and electroless plating.

14. A method for manufacturing an integrated circuit inductance, comprising:
providing a first dielectric layer and a first photo-resist layer thereon;
forming a first pattern in said first photo-resist layer through exposing a portion of said first dielectric layer, said first pattern defining a plurality of first conductive wires substantially in parallel with one another;
filling a first conductive material into said first pattern to form said first conductive wires, wherein each said first conductive wire defines a cross wire equal in length passing through the center of said first conductive wire;
removing said first photo-resist layer;
forming a second dielectric layer over said first conductive wires;
forming a second photo-resist layer on said second dielectric layer;
forming a plug pattern in said second photo-resist layer through exposing a portion of said second dielectric layer, wherein said plug pattern has a plurality of plugs located on a plurality of terminals of said first conductive wires and said cross wires;
etching said second dielectric layer with said plug pattern as a mask to expose said two terminals of each said first conductive wire and said cross wire;
filling a second conductive material into said plug pattern to form said plugs in parallel with one another and substantially perpendicular to said first conductive wires and said cross wires;
removing said second photo-resist layer;
forming a third photo-resist layer on said second dielectric layer and said plugs;
forming a second pattern in said third photo-resist layer through exposing a portion of said second dielectric layer and said plugs, said second pattern defining a plurality of second conductive wires substantially in parallel with one another, wherein said second pattern connects two said plugs which are respectively located at the terminals of each said first conductive wire and said cross wire;
filling a third conductive material into said second pattern to form said second conductive wires substantially perpendicular to said plugs;
removing said third photo-resist layer; and
forming a third dielectric layer over said second conductive wires and said second dielectric layer.

15. The method according to claim 14, wherein said first conductive material is selected from the group consisting of copper and aluminum.

16. The method according to claim 14, wherein said first conductive material is deposited by a method selected from the group consisting of physical deposition and chemical deposition.

17. The method according to claim 16, wherein said physical deposition is selected from the group consisting of evaporation and sputtering methods.

18. The method according to claim 16, wherein said chemical deposition is selected from the group consisting of chemical vapor deposition and electroless plating.

19. The method according to claim 14, wherein said second conductive material is selected from the group consisting of copper and aluminum.

20. The method according to claim 14, wherein said second conductive material is deposited by a method selected from the group consisting of physical deposition and chemical deposition.

21. The method according to claim 20, wherein said physical deposition is selected from the group consisting of evaporation and sputtering methods.

22. The method according to claim 20, wherein said chemical deposition is selected from the group consisting of chemical vapor deposition and electroless plating.

23. The method according to claim 14, wherein said third conductive material is selected from the group consisting of copper and aluminum.

24. The method according to claim 14, wherein said third conductive material is deposited by a method selected from the group consisting of physical deposition and chemical deposition.

25. The method according to claim 24, wherein said physical deposition is selected from the group consisting of evaporation and sputtering methods.

26. The method according to claim 24, wherein said chemical deposition is selected from the group consisting of chemical vapor deposition and electroless plating.

* * * * *